US006656769B2

United States Patent
Lee et al.

(12) 
(10) Patent No.: US 6,656,769 B2
(45) Date of Patent: Dec. 2, 2003

(54) METHOD AND APPARATUS FOR DISTRIBUTING MOLD MATERIAL IN A MOLD FOR PACKAGING MICROELECTRONIC DEVICES

(75) Inventors: Kian Chai Lee, Singapore (SG); Teoh Bee Yong Tim, Singapore (SG); Vijendran M, Singapore (SG); Lien Wah Choong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/851,604

(22) Filed: May 8, 2001

(65) Prior Publication Data

US 2002/0072153 A1 Jun. 13, 2002

Related U.S. Application Data

(60) Provisional application No. 60/240,927, filed on May 8, 2000.

(51) Int. Cl.[7] .......................... H01L 21/49; H01L 27/48; H01L 21/50
(52) U.S. Cl. .................. 438/112; 438/124; 438/126
(58) Field of Search ................................ 438/112, 124, 438/126

(56) References Cited

U.S. PATENT DOCUMENTS

| 5,275,546 | A | 1/1994 | Fierkens |
| 5,429,488 | A | 7/1995 | Neu |
| 5,593,927 | A | 1/1997 | Farnworth et al. |
| 5,677,566 | A | 10/1997 | King et al. |
| 5,696,033 | A | 12/1997 | Kinsman |
| 5,739,585 | A | 4/1998 | Akram et al. |
| D394,844 | S | 6/1998 | Farnworth et al. |
| D402,638 | S | 12/1998 | Farnworth et al. |
| 5,851,845 | A | 12/1998 | Wood et al. |
| 5,891,753 | A | 4/1999 | Akram |
| 5,893,726 | A | 4/1999 | Farnworth et al. |
| 5,898,224 | A | 4/1999 | Akram |
| 5,933,713 | A | 8/1999 | Farnworth |
| 5,938,956 | A | 8/1999 | Hembree et al. |
| 5,958,100 | A | 9/1999 | Farnworth et al. |
| 5,986,209 | A | 11/1999 | Tandy |
| 5,989,941 | A | 11/1999 | Wensel |
| 5,990,566 | A | 11/1999 | Farnworth et al. |
| 5,994,784 | A | 11/1999 | Ahmad |

(List continued on next page.)

FOREIGN PATENT DOCUMENTS

| EP | 0 489 349 A1 | 6/1992 |
| JP | 11 274191 A | 10/1999 |
| JP | 2000 012578 A | 1/2000 |

OTHER PUBLICATIONS

Oct. 10, 2001 International Search Report, International Application No. PCT/US01/14999, Aug. 5, 2001, 4 pages.

*Primary Examiner*—Olik Chaudhuri
*Assistant Examiner*—William M. Brewster
(74) *Attorney, Agent, or Firm*—Perkins Coie LLP

(57) ABSTRACT

A method and apparatus for distributing a mold material in a mold for packaging microelectronic devices. In one embodiment, the microelectronic devices are placed on a substrate and the substrate is at least partially enclosed by the device region of a mold cavity. A mold material is passed along a flow axis through at least one entrance port into an intermediate region of the mold. The mold material is then passed from the intermediate region into the device region through a single opening spaced apart from and positioned between the entrance port and the microelectronic device. The single opening has a flow area transverse to the flow axis smaller than a flow area immediately upstream of the single opening to restrict the flow through the single opening. The mold material can accordingly form a uniform leading edge as it exits the opening and before it impinges on the microelectronic device.

7 Claims, 4 Drawing Sheets

U.S. PATENT DOCUMENTS

| | | | |
|---|---|---|---|
| RE36,469 E | 12/1999 | Wood et al. | |
| 6,008,070 A | 12/1999 | Farnworth | |
| 6,008,074 A | * 12/1999 | Brand | 438/126 |
| 6,020,629 A | 2/2000 | Farnworth et al. | |
| 6,025,728 A | 2/2000 | Hembree et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,072,236 A | 6/2000 | Akram et al. | |
| 6,075,288 A | 6/2000 | Akram | |
| 6,097,087 A | 8/2000 | Farnworth et al. | |
| 6,103,547 A | 8/2000 | Corisis et al. | |
| 6,107,122 A | 8/2000 | Wood et al. | |
| 6,107,680 A | 8/2000 | Hodges | |
| 6,117,382 A | 9/2000 | Thummel | |
| 6,124,634 A | 9/2000 | Akram et al. | |
| 6,150,717 A | 11/2000 | Wood et al. | |
| 6,159,764 A | 12/2000 | Kinsman et al. | |
| 6,172,419 B1 | 1/2001 | Kinsman | |
| 6,184,465 B1 | 2/2001 | Corisis | |
| 6,198,172 B1 | 3/2001 | King et al. | |
| 6,208,519 B1 | 3/2001 | Jiang et al. | |
| 6,210,992 B1 | 4/2001 | Tandy et al. | |
| 6,215,175 B1 | 4/2001 | Kinsman | |
| 6,228,548 B1 | 5/2001 | King et al. | |
| 6,229,202 B1 | 5/2001 | Corisis | |
| 6,246,108 B1 | 6/2001 | Corisis et al. | |
| 6,258,624 B1 | 7/2001 | Corisis | |
| 6,259,153 B1 | 7/2001 | Corisis | |
| 6,277,671 B1 | 8/2001 | Tripard | |
| 6,284,571 B1 | 9/2001 | Corisis et al. | |
| 6,291,894 B1 | 9/2001 | Farnworth et al. | |
| 6,294,839 B1 | 9/2001 | Mess et al. | |
| 6,303,981 B1 | 10/2001 | Moden | |
| 6,303,985 B1 | 10/2001 | Larson et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,331,221 B1 | 12/2001 | Cobbley | |
| 6,331,453 B1 | 12/2001 | Bolken et al. | |
| 6,332,766 B1 | 12/2001 | Thummel | |
| 6,338,813 B1 | * 1/2002 | Hsu et al. | 264/272.14 |

* cited by examiner

METHOD AND APPARATUS FOR DISTRIBUTING MOLD MATERIAL IN A MOLD FOR PACKAGING MICROELECTRONIC DEVICES

CROSS-REFERENCE TO RELATED APPLICATION

This application claims the benefit of provisional U.S. application Ser. No. 60/240,927, filed May 8, 2000, (formerly non-provisional application Ser. No. 09/566,776) entitled "METHOD AND APPARATUS FOR DISTRIBUTING MOLD MATERIAL IN A MOLD FOR PACKAGING MICROELECTRONIC DEVICES" which is hereby incorporated by reference.

TECHNICAL FIELD

This invention relates to methods and apparatuses for distributing mold materials in a mold for packaging microelectronic devices.

BACKGROUND OF THE INVENTION

Packaged microelectronic assemblies, such as memory chips and microprocessor chips, typically include a microelectronic substrate die encased in a protective plastic covering. The die includes functional devices, such as memory cells, processor circuits, and/or interconnecting circuitry. The die also typically includes bond pads electrically coupled to the functional devices. The bond pads are coupled to pins, solder ball pads, or other types of terminals that extend outside the protective covering for connecting to buses, circuits and/or microelectronic assemblies.

In one conventional arrangement, illustrated in FIGS. 1A and 1B, several dies 40 are positioned on an upper surface of a substrate 30, such as printed circuit board (PCB). Each die 40 includes conductive leads 41 that are electrically coupled through the substrate 30 to solder ball pads on the opposite surface of the substrate 30. A mold 60 (shown in a side cross-sectional view in FIG. 1B) is positioned over the substrate 30 with a cavity 67 aligned with the dies 40. The mold 60 is lowered onto the substrate 30 until an engaging surface 69 contacts the upper surface of the substrate 30 and the dies 40 fit within the cavity 67. The cavity 67 is in fluid communication with a plurality of entrance ports 63. Each entrance port 63 has an elongated, narrow gate region 62 aligned with a corresponding gold-plated gate pad 31 on the substrate 30 when the mold 60 is placed against the upper surface of the substrate 30.

In operation, the entrance ports 63 are coupled to a source (not shown) of softened or liquid mold compound 50. The mold compound 50 is injected through the entrance ports 63 to encapsulate the dies 40, forming a package 20 with gate portions 51 extending outwardly over the gate pads 31. The mold compound 50 is allowed to harden and the package 20 is ejected from the mold 60 by driving ejection pins (not shown) against the package 20 at ejection pin locations 52. The package 20 is then broken off from the gate portions 51 along a break line 59 and is singulated to separate each packaged die 40 (and the portion of the substrate 30 to which each die 40 is attached) from the neighboring packaged dies 40. The dies 50 are preferably positioned close together and close to the edges of the package 20 to reduce the size of the package 20 and the amount of residual or waste mold compound 50 remaining after the packaged dies 40 have been singulated.

SUMMARY OF THE INVENTION

The present invention is directed toward methods and apparatuses for distributing a mold material in a mold for packaging microelectronic devices. A method in accordance with one aspect of the invention includes at least partially enclosing in a mold a microelectronic device attached to a substrate, with the microelectronic device in a device region of the mold. The method further includes passing a mold material along a flow axis through at least one entrance port into and through an intermediate region of the mold. The method still further includes encapsulating the microelectronic device by passing the mold material from the intermediate region into the device region through a single opening spaced apart from and positioned between the entrance port and the microelectronic device. The single opening has a flow area transverse to the flow axis smaller than a flow area immediately upstream of the single opening in the intermediate region of the mold.

In a further aspect of the invention, the method can include hardening the mold material, separating a first portion of the mold material adjacent to the at least one entrance port from a second portion of the mold material adjacent the intermediate region of the mold to form cracks in the second portion of the mold material, with none of the cracks intersecting the microelectronic device. The cracks define a cracked portion of the mold material and the method can further include separating the cracked portion of the mold material from the microelectronic device.

The invention is also directed toward a microelectronic device package. In one aspect of the invention, the package includes a substrate, at least one microelectronic device attached to the substrate, and a hardened mold material at least partially enclosing the microelectronic device. The mold material has a device portion immediately adjacent to the microelectronic device, a gate portion spaced apart from the device portion, and the intermediate portion between the gate portion and the device portion. The mold material further includes an indentation at an intersection of the device portion and the intermediate portion. A first cross-sectional area of the mold material at the intersection is less than a second cross-sectional area immediately adjacent to the intersection in the device portion, and also less than a third cross-sectional area immediately adjacent to the intersection in the intermediate portion.

The invention is also directed toward a mold for packaging a plurality of microelectronic devices. In one aspect of the invention, the mold includes a mold body having an external surface, an internal surface defining a mold cavity, and an engaging surface configured to engage the substrate. The mold cavity includes a device region configured to extend at least partially around the microelectronic devices, at least one entrance port in fluid communication with the device region, an intermediate region between the entrance port and the device region, and a flow restrictor between the intermediate region and the device region. The cross-sectional areas of the mold cavity immediately upstream and downstream of the flow restrictor are larger than a cross-sectional area of the mold cavity at the flow restrictor.

DETAILED DESCRIPTION

Figures 1A, 1B:
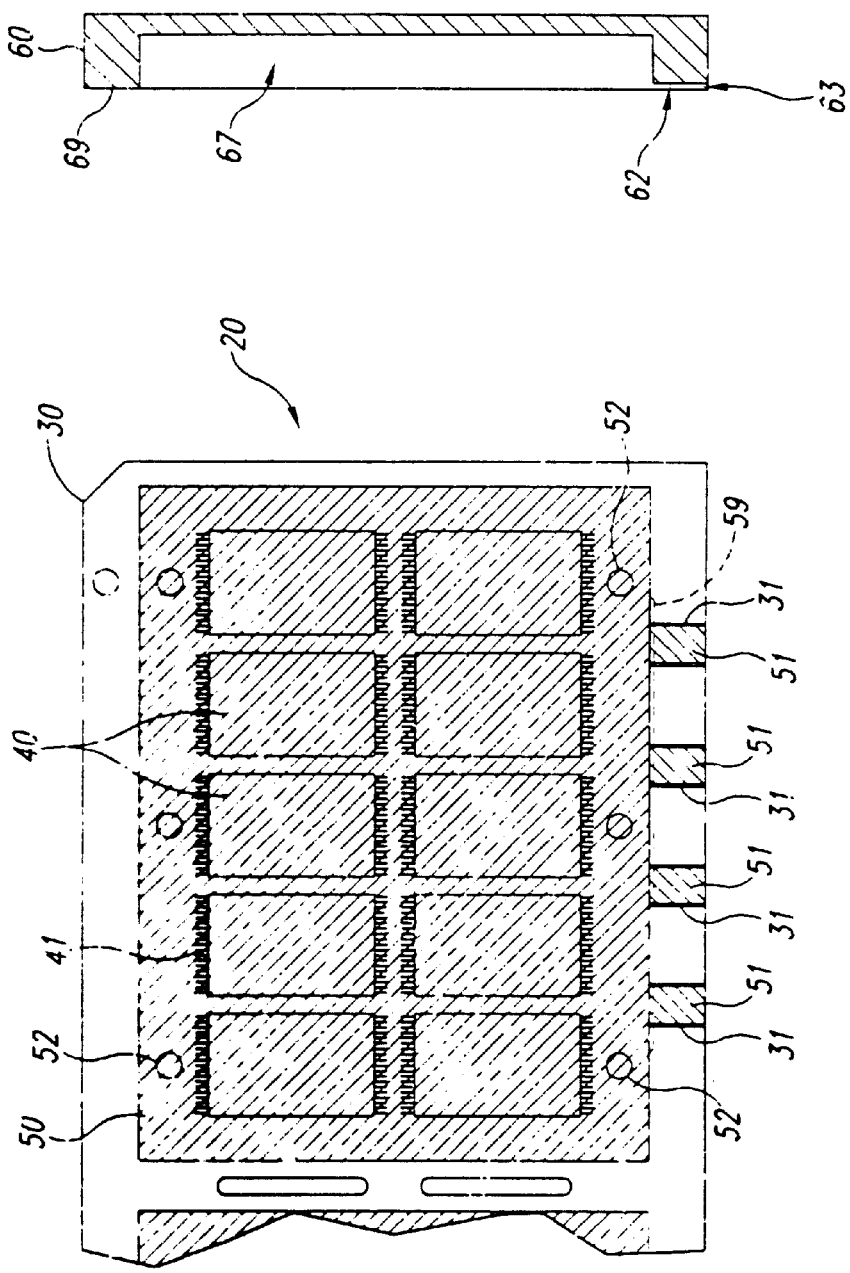
FIG. 1A is a top plan view of a device package having a substrate with a plurality of encapsulated dies in accordance with the prior art.
FIG. 1B is a cross-sectional side elevation view of a mold for encapsulating the dies of FIG. 1A in accordance with the prior art.

The conventional method described above with reference to FIGS. 1A and 1B can suffer from several drawbacks. For example, when the package 20 is broken away from the hardened gate portions 51, crevices or cracks can develop in the mold compound 50 adjacent to the dies 40. These cracks can propagate to the dies 40 and can allow moisture or other contaminants to contact and adversely affect the performance of the dies 40. Another drawback is that the flow of the mold compound 50 into the cavity 67 may not be uniform, which can distort or deform the wire leads 41 extending away from each die 40, and/or can leave air gaps between the dies 40 and the walls of the cavity 67. When the encapsulated dies 40 are separated from each other, moisture and other contaminants can seep through the air gaps and contact the dies 40.

The present disclosure describes microelectronic device packages and methods for manufacturing such packages that can address the foregoing drawbacks. Many specific details of certain embodiments of the invention are set forth in the following description and in FIGS. 2A–4B to provide a thorough understanding of these embodiments. One skilled in the art, however, will understand that the present invention may have additional embodiments, or that the invention may be practiced without several of the details described below.

Figure 2A:
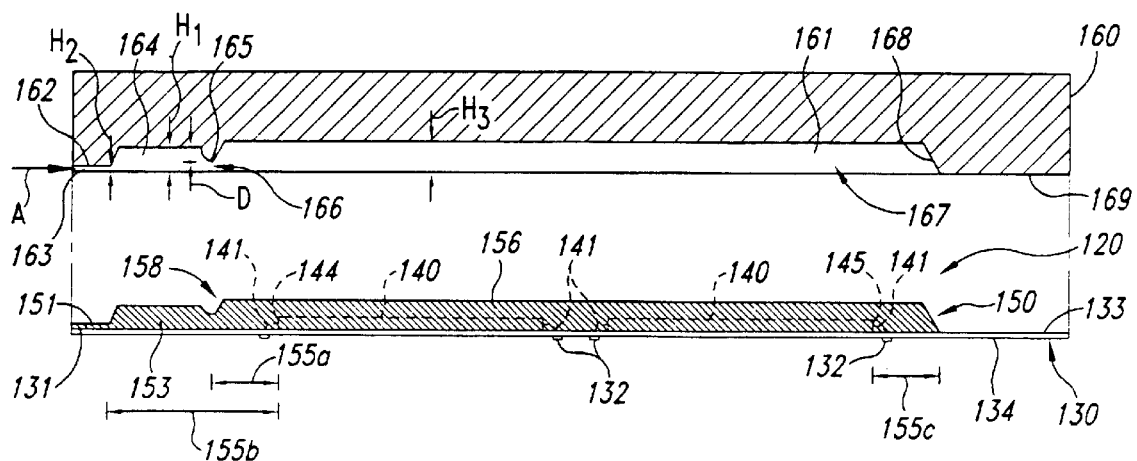
FIG. 2A is a cross-sectional elevation view of a mold positioned above a substrate after encapsulating microelectronic devices on the substrate in accordance with an embodiment of the invention.
Figure 2B:
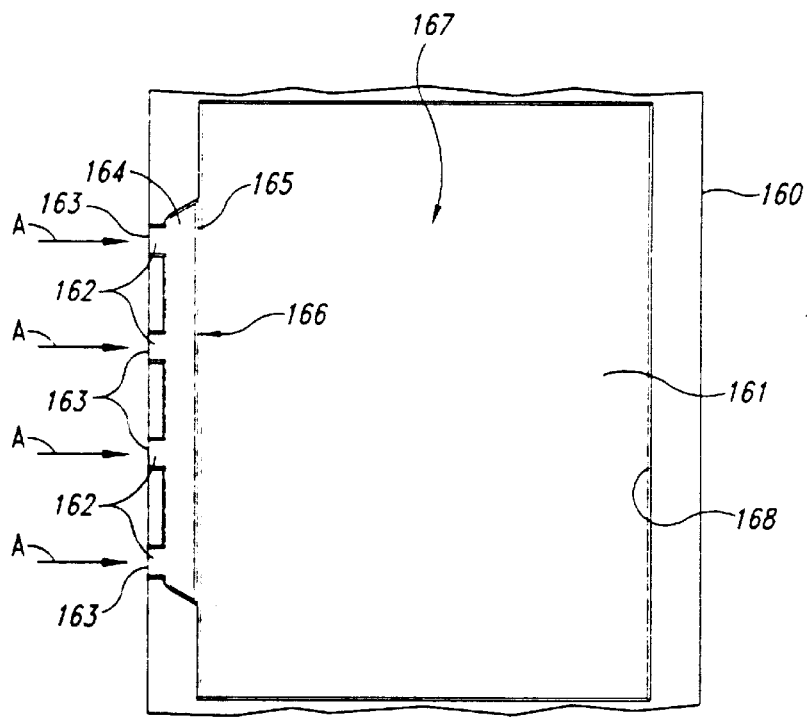
FIG. 2B is a bottom plan view of a portion of the mold shown in FIG. 2A.

FIG. 2A is a cross-sectional side view of a mold 160 positioned above a substrate 130 after encapsulating microelectronic devices 140 on the substrate 130 to form a device package 120 in accordance with an embodiment of the invention. FIG. 2B is a bottom plan view of a portion of the mold 160 shown in FIG. 2A. Referring to FIGS. 2A and 2B, the substrate 130 can include a generally flat, thin support member, such as a PCB having an upper surface 133, a lower surface 134, and conductive layers and/or vias (not shown) extending between the upper and lower surfaces 133 and 134. The microelectronic devices 140 are positioned on the upper surface 133 and are coupled to one end of the vias by conductive leads 141. The opposite ends of the vias are coupled to ball bond pads 132 on the lower surface 134 of the substrate 130. The microelectronic devices 140 and part of the substrate upper surface 133 are encapsulated with a mold material 150 (such as an epoxy resin) to protect the microelectronic devices 140 from moisture, oxidizers, and other environmental contaminants.

The mold material 150 is formed around the microelectronic devices 140 by positioning an engaging surface 169 of the mold 160 against the upper surface 133 of the substrate 130 and injecting the mold material 150 into the mold 160, as indicated by arrow A. Accordingly, the mold 160 includes a mold cavity 167 having a device region 161 that partially encloses the microelectronic devices 140. In one embodiment, the device region 161 is in fluid communication with a plurality of entrance ports 163 that are coupled to a source (not shown) of the mold material 150. Alternatively, the device region 161 can be supplied by a single entrance port 163. In either embodiment, the mold material 150 flows through the entrance port(s) 163 and into the device region 161 where it hardens to encapsulate the devices 140. As the mold material 150 flows into the mold 160, it forces air out from the mold 160 through air vents (not shown).

In one embodiment, the mold cavity 167 includes a plurality of gate regions 162 just downstream of the entrance ports 163. Each gate region 162 has a shorter vertical extent (as seen in FIG. 2A) than other portions of the cavity 167 so that gate portions 151 of the mold material 150 (i.e., the portions of the mold material 150 that harden in the gate regions) are relatively small and fragile. Accordingly, the device package 120 can be easily separated from the gate portions 151, as described below with reference to FIG. 3. In a further aspect of this embodiment, each gate region 162 of the mold 160 is aligned with a gate pad 131 on the substrate 130. Each gate pad 131 can be gold-plated to allow the gate portions 151 of the mold material 150 to more easily separate from the substrate 130. Accordingly, the device package 120 can be more easily separated from the gate portions 151.

In one embodiment, the cavity 167 further includes an intermediate region 164 between the gate regions 162 and the device region 161. In one aspect of this embodiment, the flow area of the intermediate region 164 (i.e., the cross-sectional area of the intermediate region 164, taken normal to the flow direction of the mold material through the cavity, indicated by arrow A) is greater than the combined flow areas of the gate regions 162. Accordingly, separate flows of mold material 150 entering the intermediate region 164 from adjacent gate regions 162 will tend to coalesce in the intermediate region 164 before advancing to the device region 161.

In another aspect of this embodiment, the mold 160 includes a flow restriction 165 that defines an opening 166 between the intermediate region 164 and the device region 161. The restriction 165 forms an indentation 158 in the mold material 150 and can further improve the uniformity of the flow of mold material 150 into the device region 161 of the cavity 167. For example, in one embodiment, a depth D of the restriction 165 is from about 0.05 mm to about 0.2 mm (relative to an upper surface of the intermediate region 164) and in other embodiments, the depth D can have other values and/or arrangements. For example, the restriction 165 can extend transverse to the plane of FIG. 2A. In any of these embodiments, the restriction 165 and the opening 166 can control the flow of the mold material 150 in a manner described in greater detail below with reference to FIG. 3.

In one embodiment, the opening 166 has a flow area transverse to the plane of the substrate 130 that is less than a flow area immediately downstream of the opening, in the device region 161. The flow area of the opening 166 is also less than a flow area immediately upstream of the opening 166 in the intermediate region 164. In a further aspect of this embodiment, the opening 166 is spaced apart from a forward edge 144 of the nearest microelectronic device 140 by distance 155a of from about 4 mm to about 6 mm. The distance 155a can be about 5.6 mm for an embodiment of the configuration shown in FIG. 2A.

In one aspect of an embodiment shown in FIG. 2A, a height $H_1$ of the intermediate region 164 is greater than a height $H_2$ of the gate regions 162. In another aspect of this embodiment, the height $H_1$ of the intermediate region 164 is less than or equal to a height $H_3$ of the device region 161.

For example, in one embodiment, $H_1$ is about 0.1 mm and $H_3$ is about 0.2 mm. Accordingly, an intermediate portion 153 of the hardened mold material 150 in the intermediate region 164 will not project above a device portion 156 of hardened mold material 150 in the device region 161. As a result, the package 120 can lie flat when removed from the mold 160, inverted, and placed on a flat surface. Keeping the device package 120 in a flat orientation can be important in subsequent processing steps, such as attaching solder balls to the ball bond pads 132.

Figure 3:
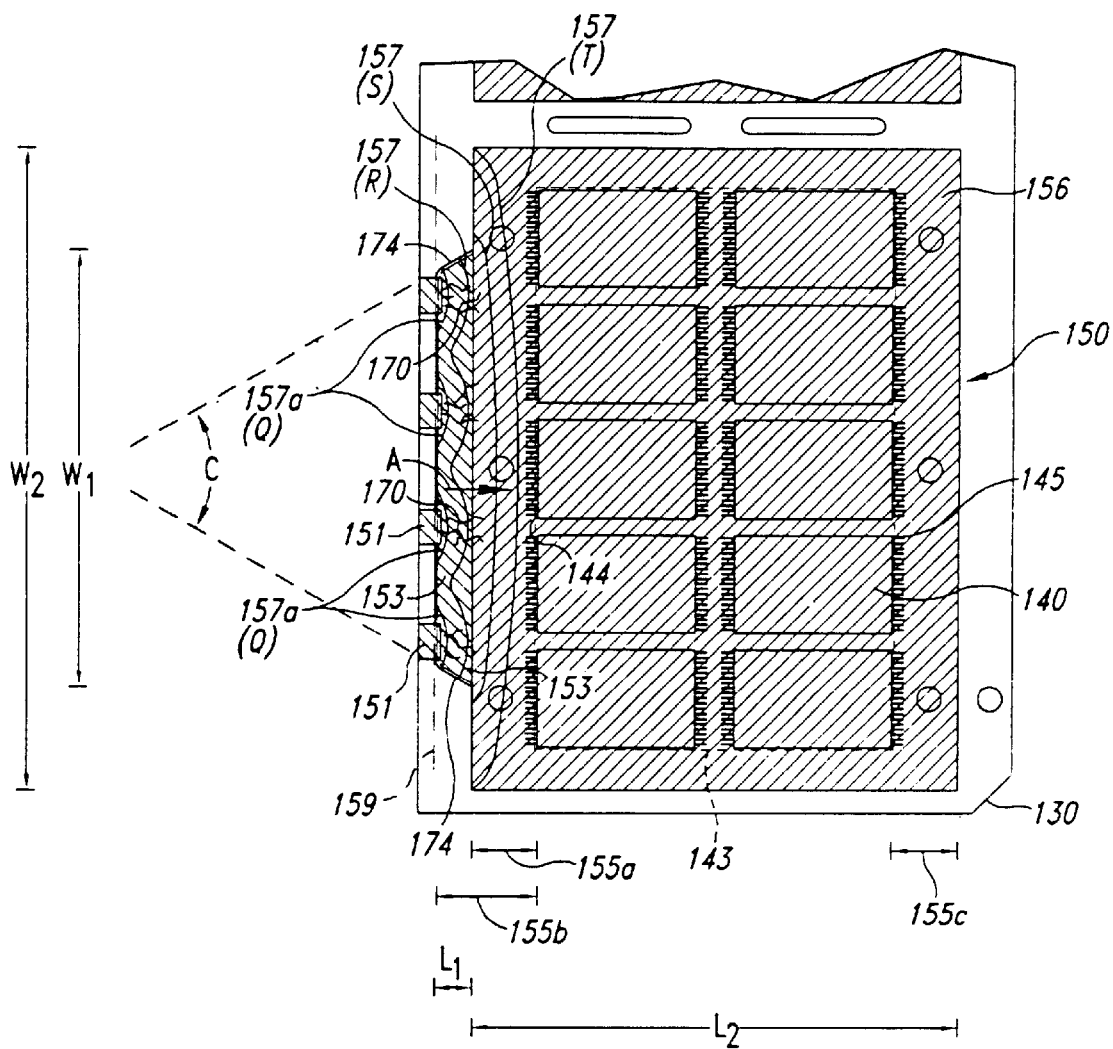
FIG. 3 is a partially schematic, top plan view of the substrate and encapsulated microelectronic devices shown in FIG. 2.

FIG. 3 is a top plan view of the substrate 130, the mold material 150 and the microelectronic devices 140 shown in FIG. 2A. In one embodiment, the microelectronic devices 140 are arranged in a 2×5 array 143 (outlined in dashed lines in FIG. 3). In other embodiments, the package 120 can have more or fewer microelectronic devices 140 positioned in other arrangements, as will be described in greater detail below with reference to FIG. 4. In still further embodiments, the microelectronic devices 140 can be stacked on each other, and the stacked devices can be arranged in the array 143. In any of these embodiments, the device portion 156 of the mold material 150 surrounds the microelectronic devices 140 and corresponds to the shape and size to the device region 161 of the mold cavity 167 (FIGS. 2A, 2B). The intermediate portion 153 of the mold material 150 (which corresponds in shape and size to the intermediate region 164 of the mold cavity 167) extends between the device portion 156 and four gate portions 151 (which correspond in shape and size to the gate regions 162).

During the injection of the mold material 150 into the cavity 167, the mold material 150 has a leading edge 157 that advances over the substrate 130 and the microelectronic devices 140. For purposes of illustration, the leading edge 157 is shown in FIG. 3 at four sequential positions, identified by letters Q, R, S, and T. Referring now to FIGS. 2A, 2B and 3, when the mold material 150 first enters the intermediate region 164 (position Q), it forms separate leading edge portions 157a at the junctions between each gate region 162 and the intermediate region 164. As the leading edge portions 157a progress through the intermediate region 164, they merge to form a single leading edge 157 (position R).

In one aspect of an embodiment shown in FIGS. 2A, 2B and 3, the mold material 150 completely fills the intermediate region 164 before passing through the opening 166 leading to the device region 161. Alternatively, the mold material 150 begins to pass through the opening 166 before the entire intermediate region 164 fills, but before the mold material 150 first contacts any of the microelectronic devices 140. In either of these embodiments, at least a portion of the leading edge 157 flattens as it passes through the opening 166 (position S). The leading edge 157 maintains a generally straight, flattened profile as it approaches and engages the nearest microelectronic device 140 (position T), with the leading edge 157 parallel to or approximately parallel to the forward-facing edge 144 of at least one of the devices 140 and/or the device array 143. In one aspect of this embodiment, the leading edge 157 is at least approximately parallel to the entire length of the forward-facing edge 144 of one or more of the microelectronic devices 140. Accordingly, the leading edge 157 can be parallel to a substantial portion of the edge of the device array 143.

In one aspect of an embodiment shown in FIGS. 2A, 2B and 3, sidewalls of the intermediate region 164 of the mold 160 are canted outwardly to form canted sidewalls 174 of the mold material 150 (FIG. 3). In one embodiment, the sidewalls 174 are canted by an included angle C of about 60°±20°, and in other embodiments, the included angle C can have other values, so long as the intermediate region sidewalls do not inhibit the flow of the mold material 150 into the device region 161.

After the mold material 150 encapsulates the microelectronic devices 150, the mold material 150 is cured or otherwise allowed to harden. The encapsulated microelectronic devices 140 and the substrate 130 are removed as a unit from the mold 160 and are separated from the gate portions 151 along a separation line 159 to form the device package 120. The intermediate portion 153 is then removed from the package is 120. In one embodiment, the microelectronic devices can remain together in the package 120; alternatively, the package 120 can be singulated to separate each encapsulated device 140 for individual coupling to other devices and/or circuits.

In one aspect of an embodiment described above with reference to FIGS. 2A, 2B and 3, a ratio of the width $W_1$ of the intermediate portion 153 (transverse to the flow direction A) to a length of $L_1$ of the intermediate portion 153 (aligned with the flow direction A) can be from about 10 to about 15. In other embodiments, this ratio can have other values that result in relatively uniform mold material leading edges 157. In another aspect of these embodiments, a ratio of the width $W_1$ of intermediate portion 153 to a width $W_2$ of the device portion 156 can be from about 0.3 to about 1.0. A ratio of the length $L_1$ of the intermediate portion 153 to a length $L_2$ of the device portion 156 can be from about 0.02 to about 0.10. A ratio of a volume of the intermediate portion 153 to a volume of the device portion 156 can be from about 0.02 to about 0.07.

One feature of an embodiment of the apparatus and method described above with reference to FIGS. 2A, 2B and 3 is that the intermediate region 164 is sized to allow the individual leading edge portions 157a to coalesce and form a leading edge 157 that is parallel to or approximately parallel to the array 143 over the entire forward edge 144 of at least one of the microelectronic devices 140. Accordingly, the leading edge 157 is transverse to the primary axial flow direction A of the mold material 150 as the mold material 150 enters the cavity 167. One advantage of this feature is that the mold cavity 167 can more uniformly fill with mold material 150, reducing the likelihood for forming air pockets in the hardened mold material 150. As such, it is expected that several embodiments of the device package 120 will not be impaired by moisture or other contaminants.

Another advantage is that the uniform leading edge 157 is less likely to damage the leads 141. For example, the leading edge 157 will be approximately perpendicular to most of the leads 141 because the leading edge is generally straight and transverse to the flow direction A. This is unlike some conventional leading edges that are highly bowed and can accordingly strike the leads 141 with a substantial transverse velocity component. This transverse velocity can break or bend the leads 141. The relatively straight leading edge 157 may also be less likely than conventional mold material leading edges to bend or break the leads 141 proximate to an aft edge 145 of the devices 140 and/or the device array 143. For example, with conventional highly bowed leading edges, some of the mold material 150 may pass through the entire device array 143 to a rear edge 168 of the cavity 167 well ahead of the rest of the mold material 150. This advance portion of the mold material 150 can reflect from the rear edge 168 and generate lateral waves that strike the leads 141 at the aft edges 145 of the devices 140 with a substantial transverse velocity causing the leads 141 to bend or break.

Still another feature of the generally straight leading edge 157 is that it can provide for a more robust process than a conventional bowed leading edge. For example, in some conventional arrangements, the positions of the microelectronic devices relative to the leading edge are carefully controlled to reduce the tendency for bending and/or breaking the leads 141, and to reduce the tendency for forming air pockets in the hardened mold material. Conversely, when the generally straight leading edge 157 is introduced into the mold cavity 167, it can withstand perturbations caused by the microelectronic devices 140 without altering its shape so substantially that it damages the leads 141 or increases the number of air pockets or cavities in the mold material 150. Accordingly, the positions of the microelectronic devices and other factors associated with the encapsulation process may need not to be as manipulated to accommodate the molding process.

Still another feature of an embodiment of the apparatus and method described above with reference to FIGS. 2A, 2B and 3 is that a distance 155b between the separation line 159 and the nearest microelectronic device 140 is larger than it is in conventional arrangements. The presence of the intermediate portion 153 of the mold material 150 increases this distance. Accordingly, the position of the device array 143 relative to the outer edges of the mold compound 150 is asymmetric, with the distance 155b being greater than a distance 155c between the device array 143 and the opposite edge of the mold compound 150. An advantage of this feature is that when cracks 170 form in the mold material 150 as the package 120 is separated from the gate portions 151, the cracks 170 are less likely to extend all the way to the devices 140. Accordingly, the intermediate portion 153 of the mold material 150 can reduce the likelihood for contaminants to pass through the cracks 170 to the devices 140.

Figure 4A:
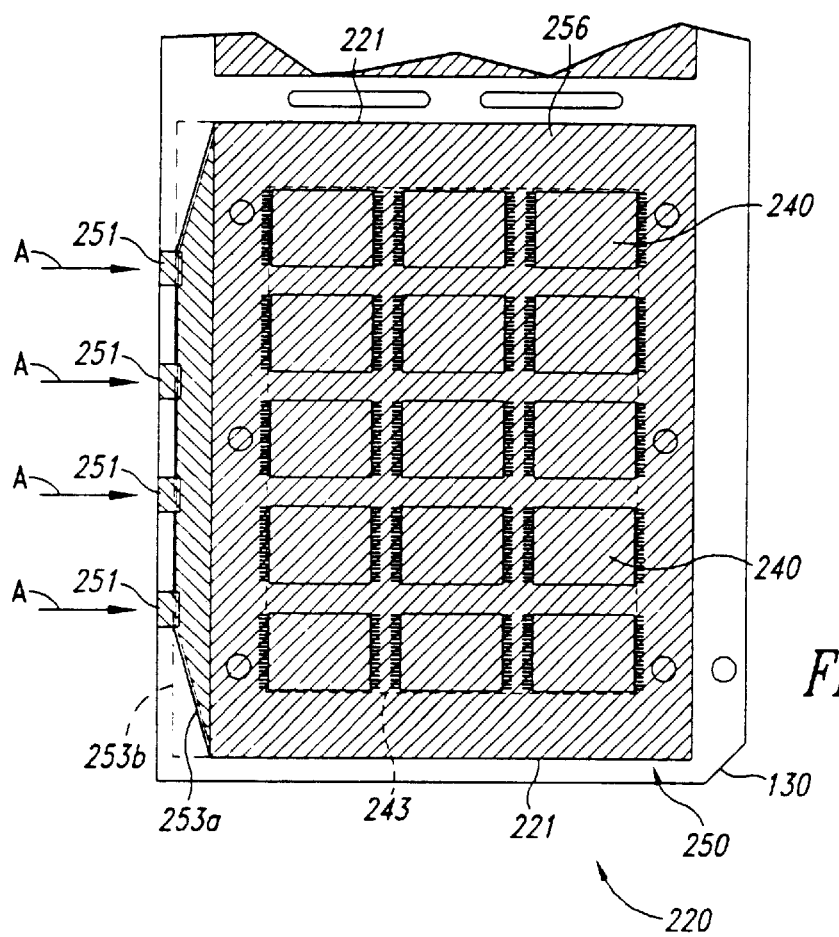
FIG. 4A is a top plan view of a substrate having encapsulated microelectronic devices in accordance with other embodiments of the invention.
Figure 4B:
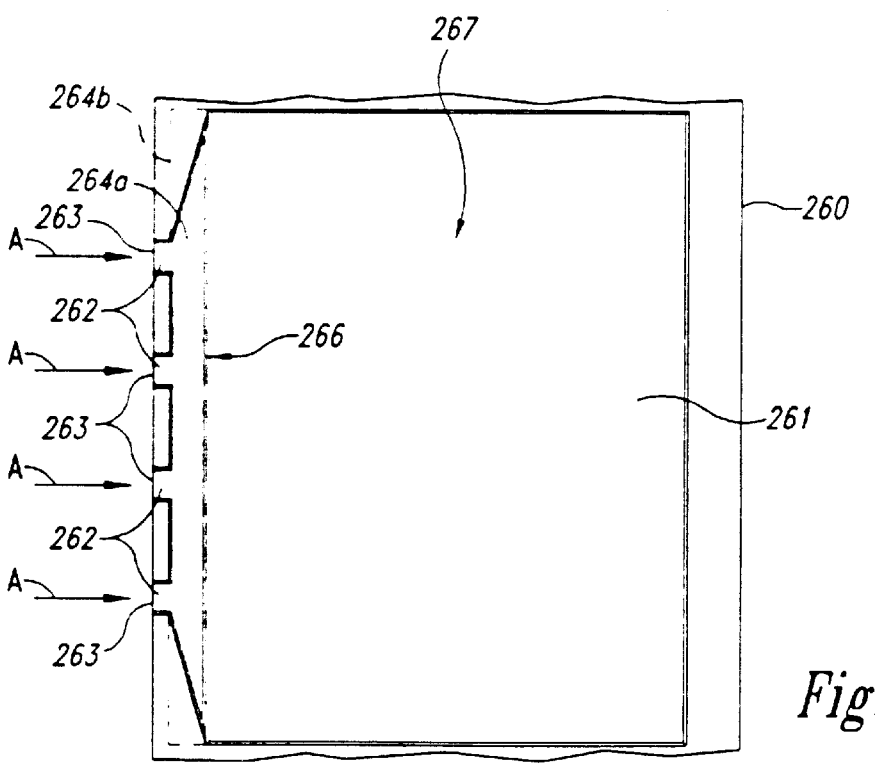
FIG. 4B is a bottom plan view of a mold for encapsulating the microelectronic devices shown in FIG. 4A.

FIG. 4A is a top plan view of a microelectronic device package 220 having an array 243 of microelectronic devices 240 arranged on a substrate 130 and encapsulated with a mold material 250 in accordance with another embodiment of the invention. FIG. 4B is a bottom plan view of a mold 260 having a cavity 267 with a device region 261, an intermediate region 264a, and a plurality of gate regions 262 and entrance ports 263 for encapsulating the microelectronic devices 240 and forming the package 220 shown in FIG. 4A. Referring to FIGS. 4A and 4B, in one aspect of this embodiment, the microelectronic devices 240 can arranged in a 3×5 array, and in other embodiments, the microelectronic devices 240 can be arranged in arrays having other dimensions.

In either embodiment, the mold material 250 includes a device portion 256 that immediately surrounds the array 243, a plurality of gate portions 251, and an intermediate portion 253a between the gate portions 251 and the device portion 256. The relative shapes and sizes of each portion of the mold material 250 are determined by the device region 261, the gate region 262 and the intermediate region 264a, respectively, of the mold 260 in a manner generally similar to that described above with reference to FIGS. 2A, 2B and 3.

In one aspect of an embodiment shown in FIGS. 4A–4B, the intermediate portion 253a extends diagonally to opposite side edges 221 of the package 220. Alternatively, the package 220 can include an intermediate portion 253b (shown in dashed lines) having a rectangular shape that extends to the side edges 221. The mold 260 can include a corresponding rectangular-shaped intermediate region 264b. In either embodiment, the intermediate portions 253a and 253b are slightly larger and have a greater lateral extent than the intermediate portion 153 described above with reference to FIGS. 2 and 3.

One feature of the arrangement shown in FIGS. 4A–4B is that the wider intermediate regions 264a and 264b can accommodate a wider opening 266 between the intermediate region and the device region 261 of the mold 260 used to form the package 220. Accordingly, the leading edge of the mold material 250 passing through the opening 266 can be more uniform. Conversely, an advantage of the arrangement described above with reference to FIGS. 2A–2B and 3 is that the package 120 uses less mold material than the package 220 because the intermediate portion 153 is smaller in the lateral direction than the intermediate portions 253a and 253b.

In other embodiments, the package 220 (and, correspondingly, the mold 260 used to form the package 220) can have other shapes. For example, the package 220 can have a single gate portion 251 (rather than the four gate portions 251 shown in FIG. 4A), so long as the intermediate portion 253a or 253b (and the corresponding intermediate region 264a or 264b of the mold 260) has a great enough extent in the axial direction A to allow the mold material 250 to form a generally straight leading edge. Alternatively, the package 220 can have more than four gate portions 251. In still another alternate embodiment, the gate portions 251 (and, correspondingly, the entrance ports 263 in the mold 260) can introduce the mold material 250 laterally from the sides of the intermediate portion 253a or 253b, rather than axially as shown in FIGS. 4A–4B.

From the foregoing, it will be appreciated that, although specific embodiments of the invention have been described herein for purposes of illustration, various modifications may be made without deviating from the spirit and scope of the invention. For example, the substrate 130 can include terminals other than ball bond pads, such as pins. The microelectronic devices and packages can have other sizes, shapes and arrangements, where the mold includes an intermediate portion between the entrance ports and the microelectronic devices and/or a flow restriction upstream of the microelectronic devices. Accordingly, the invention is not limited except as by the appended claims.

What is claimed is:

1. A method for packaging a plurality of microelectronic devices attached to a substrate, comprising:

at least partially enclosing the microelectronic devices in a mold with the microelectronic devices in a device region of the mold, the mold having a plurality of gate regions in fluid communication with a source of mold material and an intermediate region between the gate regions and the device region, wherein the gate regions have a first flow area transverse to a flow axis, and wherein the intermediate region has a second flow area greater than the first flow area and transverse to the flow axis;

passing the mold material along the axis through the gate regions over a surface of the substrate into the intermediate region; and passing the mold material from the intermediate region to the device region through a flow restriction between the intermediate region and the device region before engaging a leading edge of the mold material with the microelectronic devices.

2. The method of claim 1, further comprising:

curing a first portion of the mold material in the device region;

curing a second portion of the mold material in the intermediate region; and separating the second portion of the mold material from the first portion of the mold material and the microelectronic device.

3. The method of claim 1 wherein the substrate defines a substrate plane, further comprising restricting the passage of the mold material through the single opening in a direction transverse to the substrate plane.

4. The method of claim 1 wherein the microelectronic devices define an array having an array edge facing toward the intermediate region, the array edge having an array edge length, further comprising forming the leading edge of the mold material to be approximately parallel to the array edge over a substantial portion of the array edge length as the leading edge passes through the flow restriction.

5. The method of claim 1, further comprising passing the mold material through four gate regions into the intermediate region.

6. The method of claim 1 wherein the substrate defines a substrate plane, further comprising restricting the passage of the mold material through the flow restriction in a direction transverse to the substrate plane.

7. The method of claim 1, further comprising filling the intermediate region of the mold with the mold compound before engaging the mold compound with the microelectronic device.

* * * * *